United States Patent [19]
Yamada et al.

[11] Patent Number: 5,151,878
[45] Date of Patent: Sep. 29, 1992

[54] SEMICONDUCTOR MEMORY DEVICE

[75] Inventors: Toshio Yamada, Osaka; Michihiro Inoue, Ikoma, both of Japan

[73] Assignee: Matsushita Electric Industrial Co., Ltd., Osaka, Japan

[21] Appl. No.: 787,859

[22] Filed: Nov. 5, 1991

Related U.S. Application Data
[63] Continuation of Ser. No. 463,077, Jan. 10, 1990.

[30] Foreign Application Priority Data

Jan. 12, 1989 [JP] Japan .................................. 1-5239

[51] Int. Cl.$^5$ ............................................. G11C 13/00
[52] U.S. Cl. ................................ 365/189.01; 365/190; 365/203
[58] Field of Search ................... 365/182, 204, 189.01, 365/189.05, 190, 203

[56]  References Cited
PUBLICATIONS
Kawamoto, H. et al., "A 288Kb CMOS Pseudo SRAM," *IEEE International Solid-State Circuits Conference Article*, pp. 276-277 (1984).
Takeshima, T. et al., "A 55ns 16Mb DRAM," *IEEE International Solid-State Circuits Conference Article*, pp. 246-247 (1989).
"Micro Computer Memory," pp. 137-156 (1985).
IEEE International Solid-State Conference "A 288 Kb. CMOS Pseudo SRAM" pp. 276-277, Kawamoto et al., Feb. 24, 1984.
IEEE International Solid-State Conference "A 55 ns 16Mb Dram" pp. 246-247 T. Takashima et al. Feb. 17, 1989.

*Primary Examiner*—Terrell W. Fears
*Attorney, Agent, or Firm*—Panitch Schwarze Jacobs & Nadel

[57]  ABSTRACT

In a semiconductor memory device comprising memory cells in which first and second potentials correspond to the logic values "0" and "1", the first potential is closer to the second potential than the potential of unselected word lines, by 0.3 V or more. The pull-up transistor is of the N-type, and the pull-down transistor is of the P-type.

2 Claims, 9 Drawing Sheets

SEMICONDUCTOR MEMORY DEVICE

This is a continuation of application Ser. No. 07/463,077, filed Jan. 10, 1990.

BACKGROUND OF THE INVENTION

1. Field of the invention

This invention relates to a semiconductor memory device, and more particularly to a dynamic random access memory device (DRAM).

2. Description of the prior art

FIG. 5 illustrates schematically a DRAM comprising memory cells. A memory cell which is indicated by a broken-line circle 10 in FIG. 5 is composed of an MOS transistor and a capacitor. The configuration of a conventional DRAM will be described by illustrating the operation of the DRAM. When a row decoder 20 selects one of word lines (e.g., a word line 40), according to an address signal input from outside the semiconductor chip, the signal charges written into memory cells are read out to bit lines /BIT$_1$-/BIT$_N$, respectively, and slight differences in potential occur between bit lines /BIT$_1$ and BIT$_1$, . . . and /BIT$_N$ and BIT$_N$. These slight differences in potential are amplified by sense amplifiers SA$_1$ to SA$_N$ to be output, while their respective signal charges are written back into the same memory cells. In FIG. 5, numeral 70 indicates a pull-up wire for driving the sense amplifiers SA$_1$ to SA$_N$, and 60 is a pull-down wire. The DRAM of FIG. 5 has a memory cell array of the so-called "folded-bit" type in which there are memory cells at half of the word line and bit line intersections. The coupling capacitances between the word line 30 and bit lines (BIT$_i$ and /BIT$_i$) are C$_i$ on the side where a memory cell is connected, and /C$_i$ on the side where a memory cell is not connected.

When data of the memory cells connected to the word line 40 are read out, amplified and rewritten, depending on the read-out data pattern, coupling noises from the bit lines may enter the unselected word line 30, thus destroying the data in memory cells M3$_i$, . . . , M3$_i$, . . . M3$_N$ connected to the unselected word line 30. Below is a detailed description of this phenomenon.

FIG. 6 shows the structure of the part enclosed by a broken line 50 in FIG. 5. In FIG. 6, numeral 500 is a silicon substrate. The word lines 30 and 40 are formed from polysilicon, and the bit line /BIT$_N$ is formed from aluminum or other material. 501 and 502 are SiO$_2$ films, and 503 is a gate oxide film. 504 is an oxide film constituting the cell capacitance, 53 is a cell plate, 52 is a cell capacitance node, 51 is the source area to which the bit line /BIT$_N$ and the MOS transistor M4$_{/N}$ are connected, and 54 is a field oxide film. The coupling capacitances C$_i$ and /C$_i$ can be expressed by $$C_i = C_{GS} + C_{CW} + C_O$$

$$/C_i = C_O$$

where C$_{GS}$ is the capacitance between the gate and source of the switching transistor in the memory cell, C$_{CW}$ is the coupling capacitance between the bit line /BIT$_N$ and the word line 40 in the contact part of the bit line /BIT$_N$, and C$_O$ is the coupling capacitance between the bit line /BIT$_N$ and the word line 30 or 40. Form the above expressions, the relation C$_i$>/C$_i$ can be easily seen.

As the degree of integration of semiconductor devices has increased in recent years, the gate oxide film of MOS transistors has tended to become thinner. Therefore, the capacitance C$_{GS}$ has tended to increase. On the other hand, the introduction of self-aligned contacts due to decreased planar surface areas has brought bit lines and word lines closer and closer together in the contact areas, and as a result, the capacitance C$_{CW}$ also has tended to increase in recent years, resulting in C$_i$>>/C$_i$. In other words, among the coupling capacitances between word lines and bit lines, the capacitance at the side on which the memory cell is connected is tending to become excessively large.

With reference to FIG. 7, the operation of the memory device shown in FIG. 5 will be described. In FIG. 7, curve a depicts the change in potential in the selected word line 40. It is assumed that "1" or "0" has been written in all the memory cells M4$_{/1}$-M4$_{/N}$ connected to the selected word line. When "1" is written in all the selected memory cells M4$_{/1}$-M4$_{/N}$, the change in potential in the bit lines /BIT$_1$-/BIT$_N$ connected to the selected memory cells is illustrated by the waveform indicated by c in FIG. 7, and the change in potential in the complementary bit lines BIT$_1$-BIT$_N$ by the waveform b in FIG. 7. In other words, in FIG. 7, the bit line pairs (BIT$_1$ and /BIT$_1$-BIT$_N$ and /BIT$_N$) are precharged from time 0 to time T1. At time T1, the word line potential begins to rise, and the signal charges stored in the memory cells generate a slight potential difference, ΔV$_1$ or ΔV$_O$ (shown in FIG. 7), corresponding to "1" or "0". At time T2, the signals are amplified by the sense amplifiers SA$_1$-SA$_N$, as shown in FIG. 7. At time T3, the potential in the word line begins to drop, completing the rewriting of the data in the memory cells. Precharge then begins at time T4 in preparation for the next read-out cycle. In contrast, when "0" is written in all the selected memory cells M4$_{/1}$-M4$_{/N}$ connected to the selected word line 40, the change in potential in the bit lines /BIT$_1$-/BIT$_N$ connected to the selected memory cells is as indicated by waveform b in FIG. 7, and the change in potential in the complementary bit lines BIT$_1$-BIT$_N$ as indicated by the waveform c in FIG. 7.

Since the coupling capacitance on the side where the memory cell is connected is larger (i.e., C$_i$>>/C$_i$) as described above, the difference, ΔC=C$_i$-/C$_i$, becomes a capacitance contributing to the generation of noises entering the word lines from the bit line. The noise entering the unselected word line 30 are indicated by broken lines d and d' in FIG. 7. These noises correspond respectively to the portions Nc and Nb of the waveforms c and b in FIG. 7. That is, when rewriting or precharging a memory cell (e.g., the cell M4$_{/j}$), noises are generated in the unselected word line 30. These noises cause the destruction of the data in the memory cells (e.g., the cell M3$_j$) connected to the unselected word line 30. This will be discussed in more detail below.

FIG. 8A shows the equivalent circuit of a memory cell, and FIG. 8B is a graph illustrating the cutoff characteristic of a switching transistor, i.e., a so-called Vg - logI$_D$ graph. The current characteristic in an area below the threshold voltage V$_T$ in the Vg - logI$_D$ graph (area S in FIG. 8B) is referred to as the sub-threshold area, and has a significant effect on the holding characteristic of the memory cell. This is because, when the word line potential (i.e., the gate potential) rises transiently due to the above-mentioned noise, and even if this increased potential does not reach the threshold voltage V$_T$, the current flowing through the transistor increases logarithmically, resulting in an outflow of the signal charge. This causes the degradation of the holding characteristic.

In the prior art, this problem is dealt by designing a memory device so that the slope of the subthreshold area S of the switching transistor is steeper, and that the number of memory cells connected to a word line is reduced to decrease the coupling capacitance between the bit lines and word lines. However, these measures have become more difficult as the degree of integration of memory chips increases. That is, as the degree of integration increases, the structure of transistors becomes more complex and the number of design parameters to be controlled increases markedly. As a result, optimizing only the subthreshold area becomes difficult. Further, reducing the number of memory cells connected to a word line and increasing the number of array divisions in a memory chip require that the area of the chip be increased.

As described above, noises caused by the coupling between bit lines and unselected word lines in a prior art semiconductor memory device produce a serious problem that data stored in memory cells connected to the unselected word lines are destroyed.

SUMMARY OF THE INVENTION

The semiconductor memory device of this invention, which overcomes the above-discussed and numerous other disadvantages and deficiencies of the prior art, comprises memory cells in which first and second potentials correspond to the logic values "0" and "1", respectively, said first potential being closer to said second potential than the potential of unselected word lines, by a predetermined value.

In a preferred embodiment, the predetermined value is 0.3 V or more.

According to the invention, a semiconductor memory device comprising a sense circuit to which first and second bit lines are connected at first and second nodes, respectively, and the sense circuit comprises: a first MOS transistor of a first conductivity type connected between a first voltage line and a third node; second and third MOS transistors of a second conductivity type, the source and drain of said second MOS transistor being connected between said first and third nodes, the source and drain of said third MOS transistor being connected between said second and third nodes; a fourth MOS transistor of the second conductivity type connected between a second voltage line and a fourth node; and fifth and sixth MOS transistors of the first conductivity type, the source and drain of said fifth MOS transistor being connected between said first and fourth nodes, the source and drain of said sixth MOS transistor being connected between said second and fourth nodes, the gate of said second and fifth MOS transistors being connected to said second nodes, the gate of said third and sixth MOS transistors being connected to said first node.

According to the invention, a semiconductor memory device comprising a sense circuit to which first and second bit lines are connected at first and second nodes, respectively, the sense circuit comprises: a first MOS transistor of a first conductivity type connected between a first voltage line and a third node; second and third MOS transistors of the first conductivity type, the source and drain of said second MOS transistor being connected between said first and third nodes, the source and drain of said third MOS transistor being connected between said second and third nodes; a fourth MOS transistor of a second conductivity type connected between a second voltage line and a fourth node; and fifth and sixth MOS transistors of the second conductivity type, the source and drain of said fifth MOS transistor being connected between said first and fourth nodes, the source and drain of said sixth MOS transistor being connected between said second and fourth nodes, the gate of said second and fifth MOS transistors being connected to said second nodes, the gate of said third and sixth MOS transistors being connected to said first node.

Thus, the invention described herein makes possible the objectives of (1) providing a semiconductor memory device in which the destruction of data in memory cells caused by the capacitance coupling between a bit line and a word line can be effectively prevented from occurring;

(2) providing a semiconductor memory device which is highly reliable even when the memory is of a very large scale integrated type;

(3) providing a semiconductor memory device which is not easily affected by the substrate noise caused by peripheral circuits; and (4) providing a semiconductor memory device which does not require an internal voltage generating circuit.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

According to the invention, the potential of memory cell contents corresponding to the logic value "0" differs by 0.3 V or greater from that of unselected word lines. Even if the rise of the potential of unselected word lines is caused by the capacitance coupling between bit lines and word lines, consequently, the potential of unselected word lines does not exceed that of memory cell contents corresponding to the logic value "0".

Figure 2:
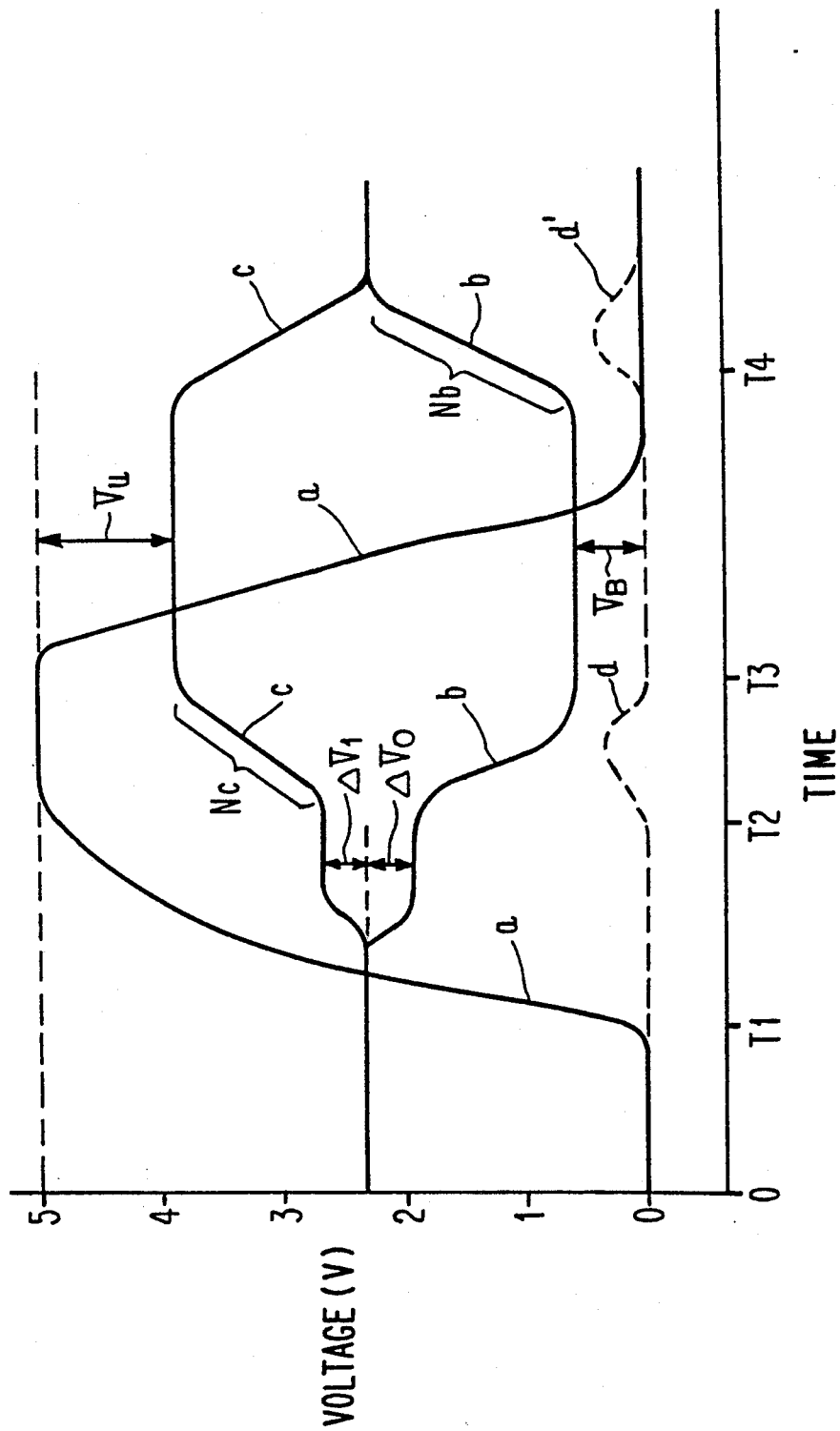
FIG. 2 illustrates waveforms at portions of the embodiment of FIG. 1.
Figure 3A:
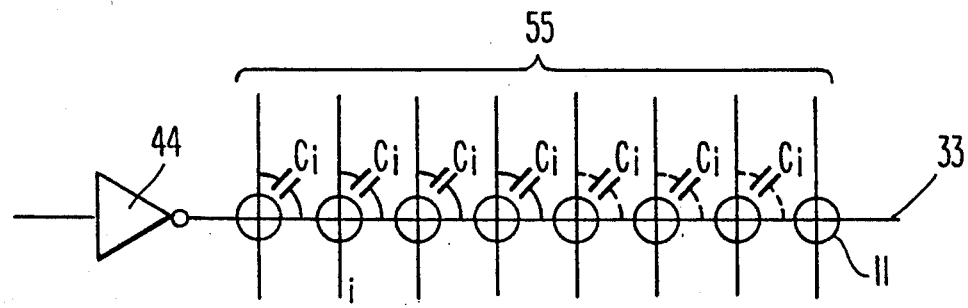
FIGS. 3A and 3B are diagrams for illustrating the potential rise in a word line.

FIG. 2 shows waveforms in a semiconductor memory device according to the invention. Unlike conventional devices, the potential of memory cell contents corresponding to logic value "0", i.e., the rewrite voltage corresponding to the logic value "0", is higher by the amount indicated by $V_B$ in FIG. 2. Therefore, even if the potential of unselected word lines rises momentarily as indicated by curve d' in FIG. 2 due to the capacitance coupling between the bit lines and the word lines, it does not exceed the potential of the memory cell contents corresponding to the logic value "0", thereby preventing data from being destroyed. It is preferable that the value of the voltage difference $V_B$ is equal to or greater than 0.3 V, as described below. FIG. 3A shows the relationship between a word line 33 and bit lines 55. The word line 33 in FIG. 3A which is formed by polysilicon corresponds to the word line 30 or 40 in FIG. 5, and the bit lines 55 to the bit lines $BIT_1$-/$BIT_N$ in FIG. 5. Numeral 11 represents a memory cell, and 44 a word line driver circuit. When the word line 33 is not selected, the potential in the majority of the bit lines 55 increases, and the coupling capacitance $C_i$ causes the potential in the unselected word line 33 to increase, resulting in destruction of data. The equivalent circuit used to demonstrate this is shown in FIG. 3B.

Figure 3B:
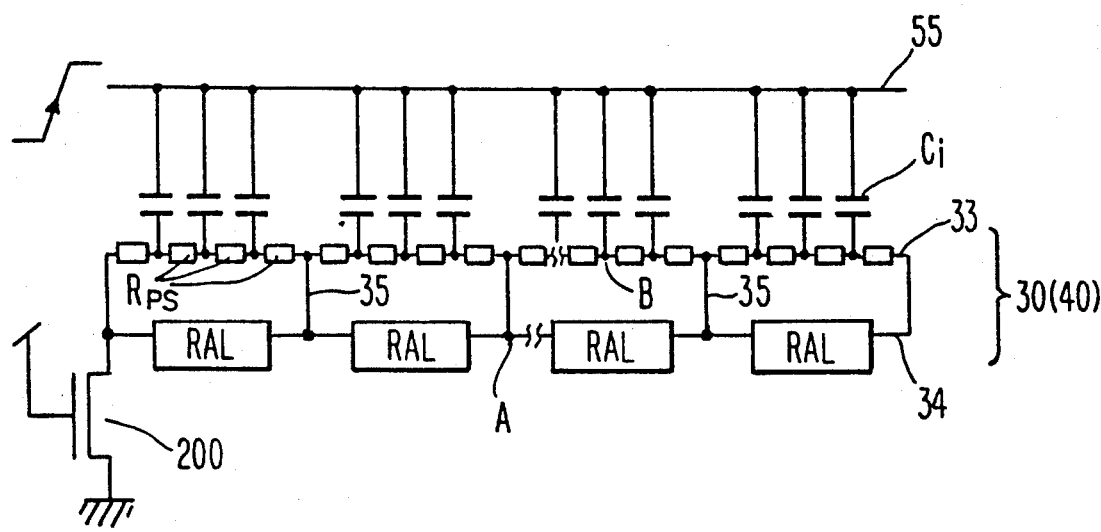
Figure 3C:
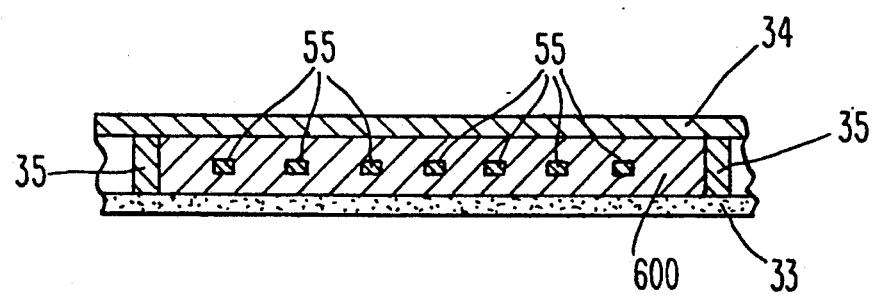
FIG. 3C is a partial sectional view of a memory device.

In FIG. 3B, numeral 200 is a MOS transistor on the pull-down side in the word line driver circuit 44, and numeral 34 is an aluminum wiring which, as shown in FIG. 3C, runs on an insulating film 600 and parallel to the word line 33. The aluminum wiring 34 is electrically connected at intervals with the word line 33 by conductors 35 to reduce the word line delay in the DRAM. The resistance of each section of the aluminum wiring 34 is indicated by RAL in FIG. 3B. Using this equivalent circuit, the inventors estimated the circuit parameters for a 16M DRAM to find the relationship between the channel width $W_N$ of the pull-down transistor 200 and the voltage difference $V_B$ in the word line under the conditions described below. The result is shown in FIG. 4.

This simulation was performed using the circuit simulator SPICE. The maximum rise rate of the potential of a bit line (i.e., the portion $N_c$ in FIG. 2) was about $10^8$ V/S. The sheet resistance of polysilicon was 50 $\Omega/\square$, and that of the aluminum wiring 0.05 $\Omega/58$. The width of both the polysilicon and aluminum wires was 0.7 $\mu m$, and the channel length of the pull-down transistor 200 was 0.7 $\mu m$. The coupling capacitance $C_i$ between a word line and a bit line was about 2 fF/bit. The number of memory cells connected to one word line was 2048.

Figure 4:
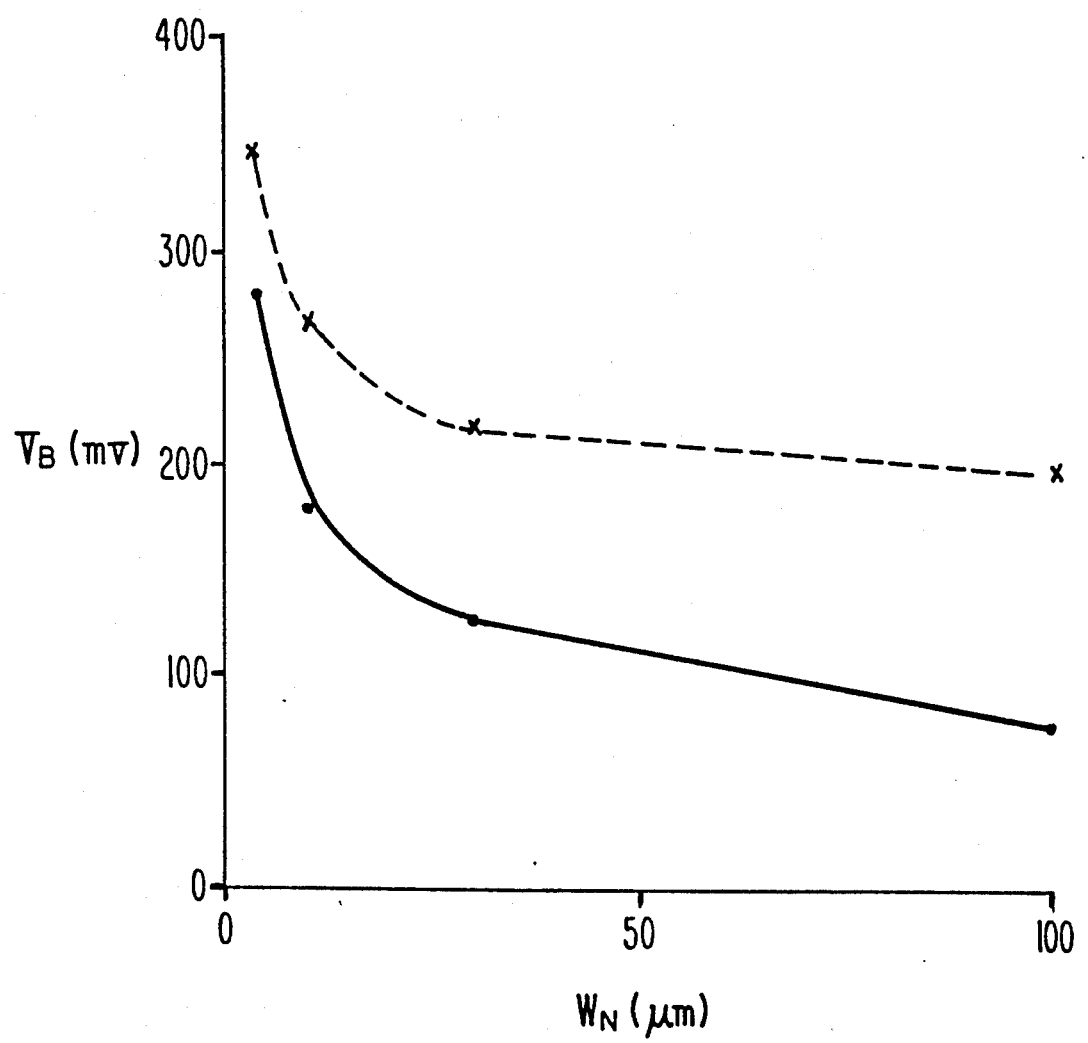
FIG. 4 is a graph showing the potential rise of a word line in the embodiment of FIG. 1.

As can be seen from FIG. 4, even if the channel length $W_N$ of the pull-down transistor is large, the rise of potential in the word line 33 (broken line in FIG. 4, potential at portion B in FIG. 3B) does not become smaller than the rise of potential in the aluminum wire 34 (solid line in FIG. 4, potential at portion A in FIG. 3B) running parallel to the word line, and converges at a fixed value of approximately 200 mV. In an actual DRAM circuit, the channel length $W_N$ is greater than about 10 $\mu m$, in which case the maximum rise in potential of the word line is less than 300 mV. From this, it can be seen that it is sufficient to raise the potential of the memory cell contents corresponding to a logic value of "0" by 0.3 V or more from that of an unselected word line.

Figure 5:
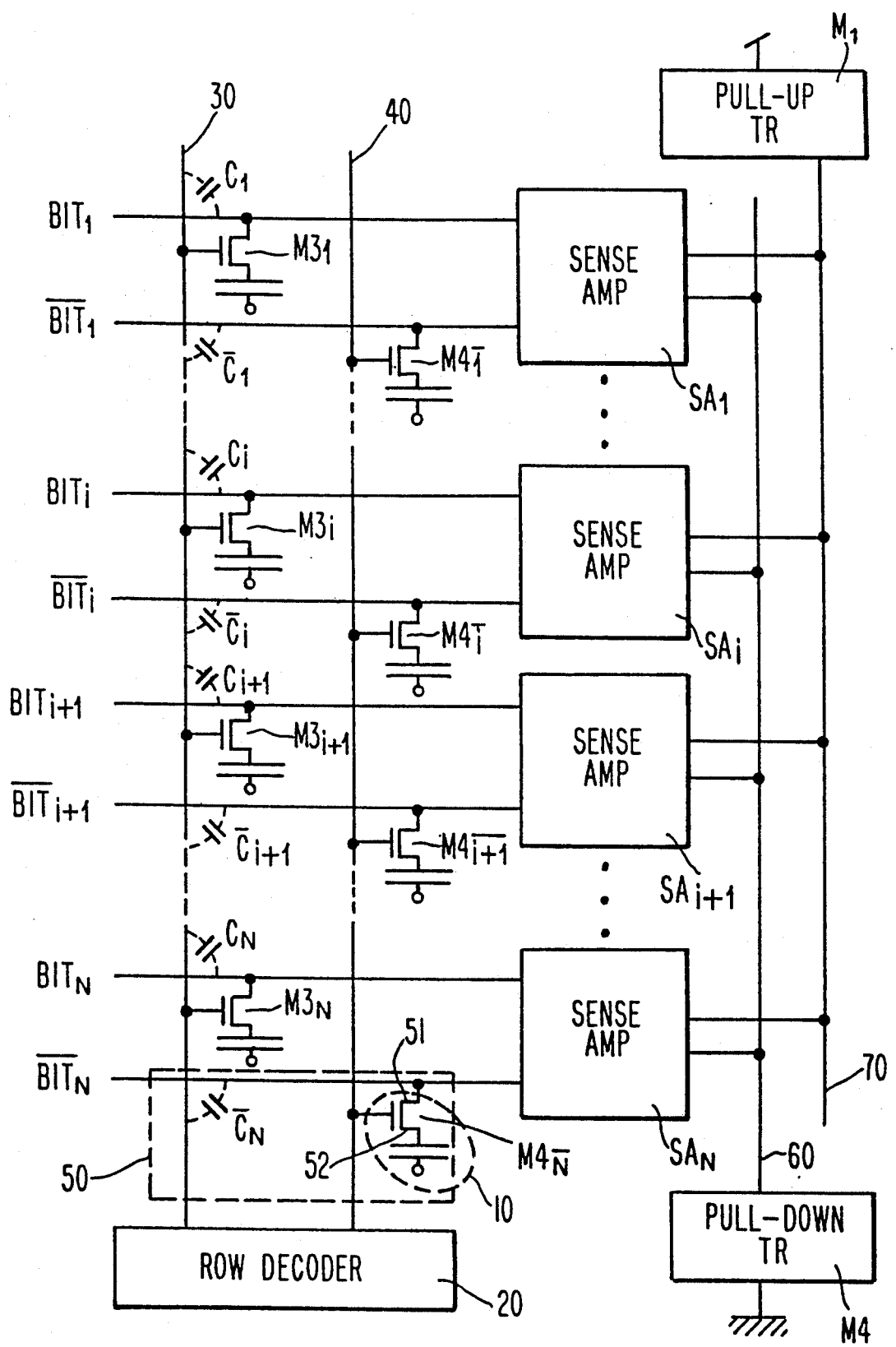
FIG. 5 is a diagram for illustrating a memory device.
Figure 6:
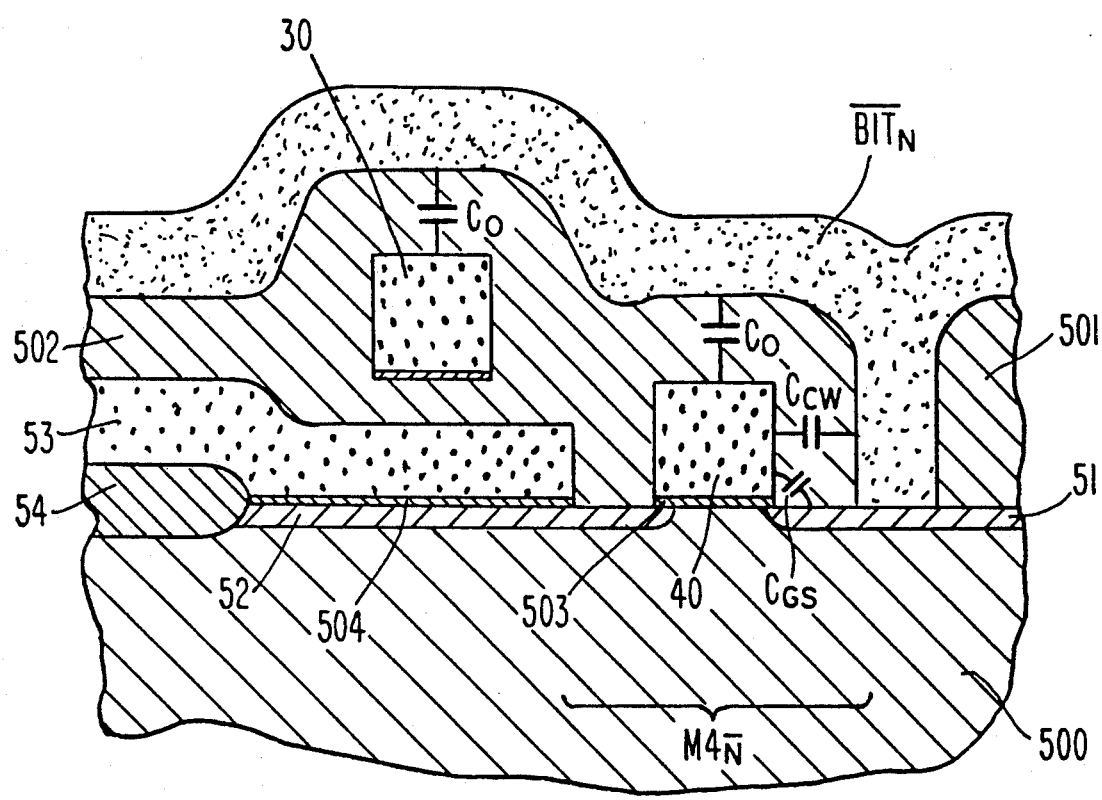
FIG. 6 is a sectional view of a memory cell.
Figure 7:
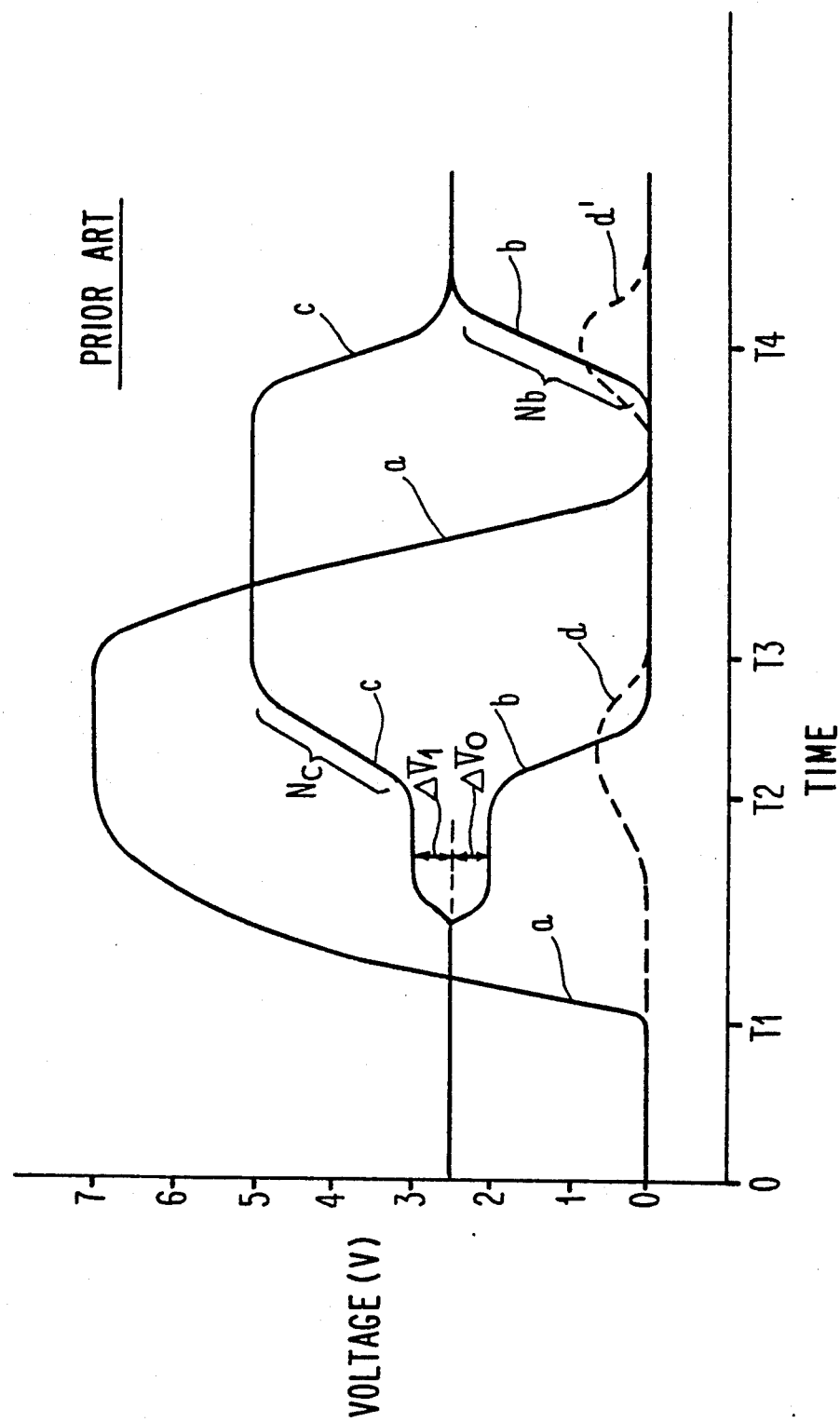
FIG. 7 is a graph for showing the potential rise of a word line in a prior art device.
Figure 8A:
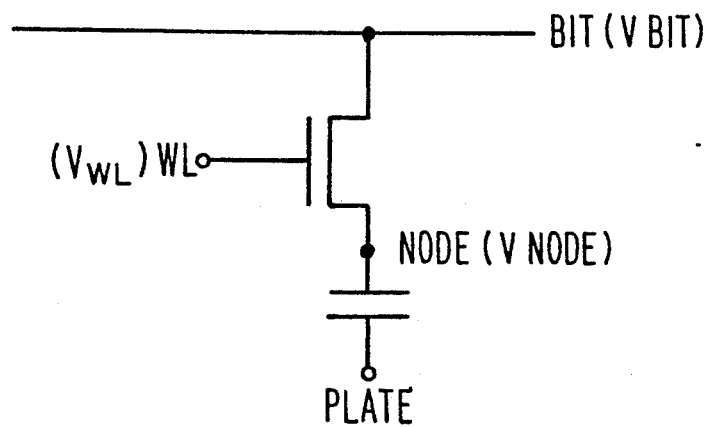
FIG. 8A shows an equivalent circuit of a memory cell.
Figure 8B:
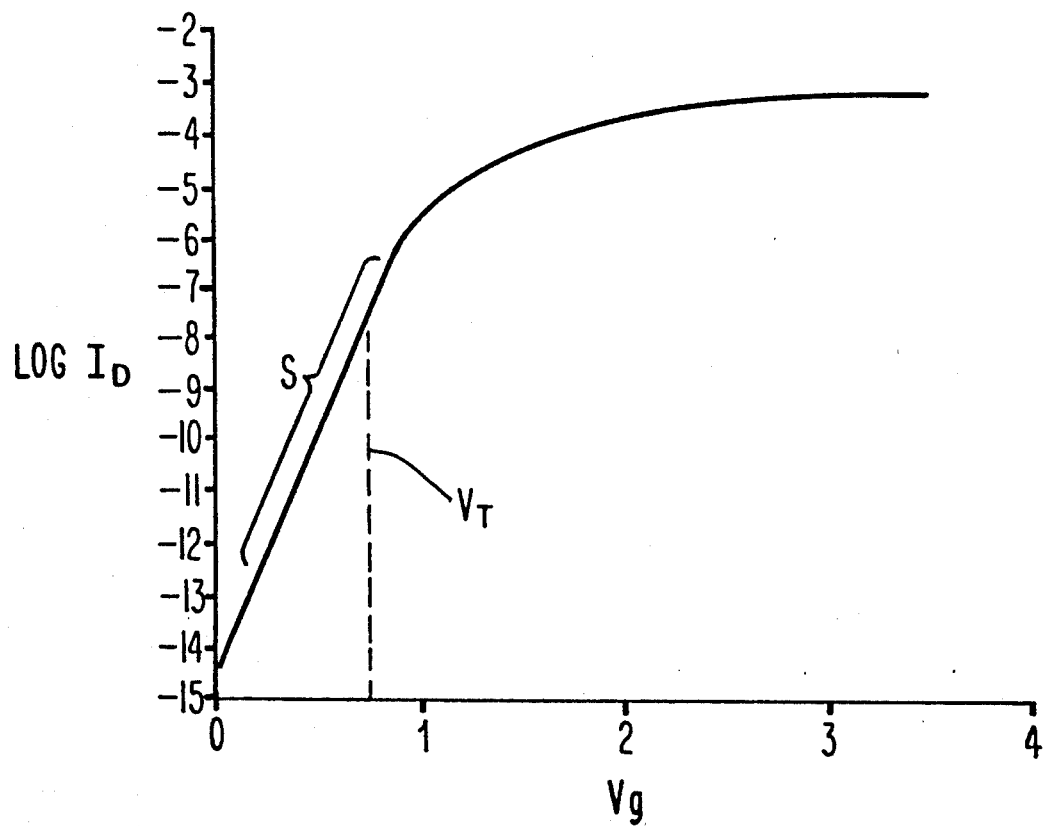
FIG. 8B is a graph showing the switching characteristic of a transistor.

Before describing the embodiment in more detail, the relationship between a sense amplifier and a sense amplifier control circuit (commonly referred to as a pull-down transistor and a pull-up transistor) is explained for the sake of better understanding of the embodiment. In most DRAMs, currents are pulled down and pulled up from the sense amplifiers $SA_1$-$SA_N$ through the common lines 60 and 70 (FIG. 5).

Figure 1:
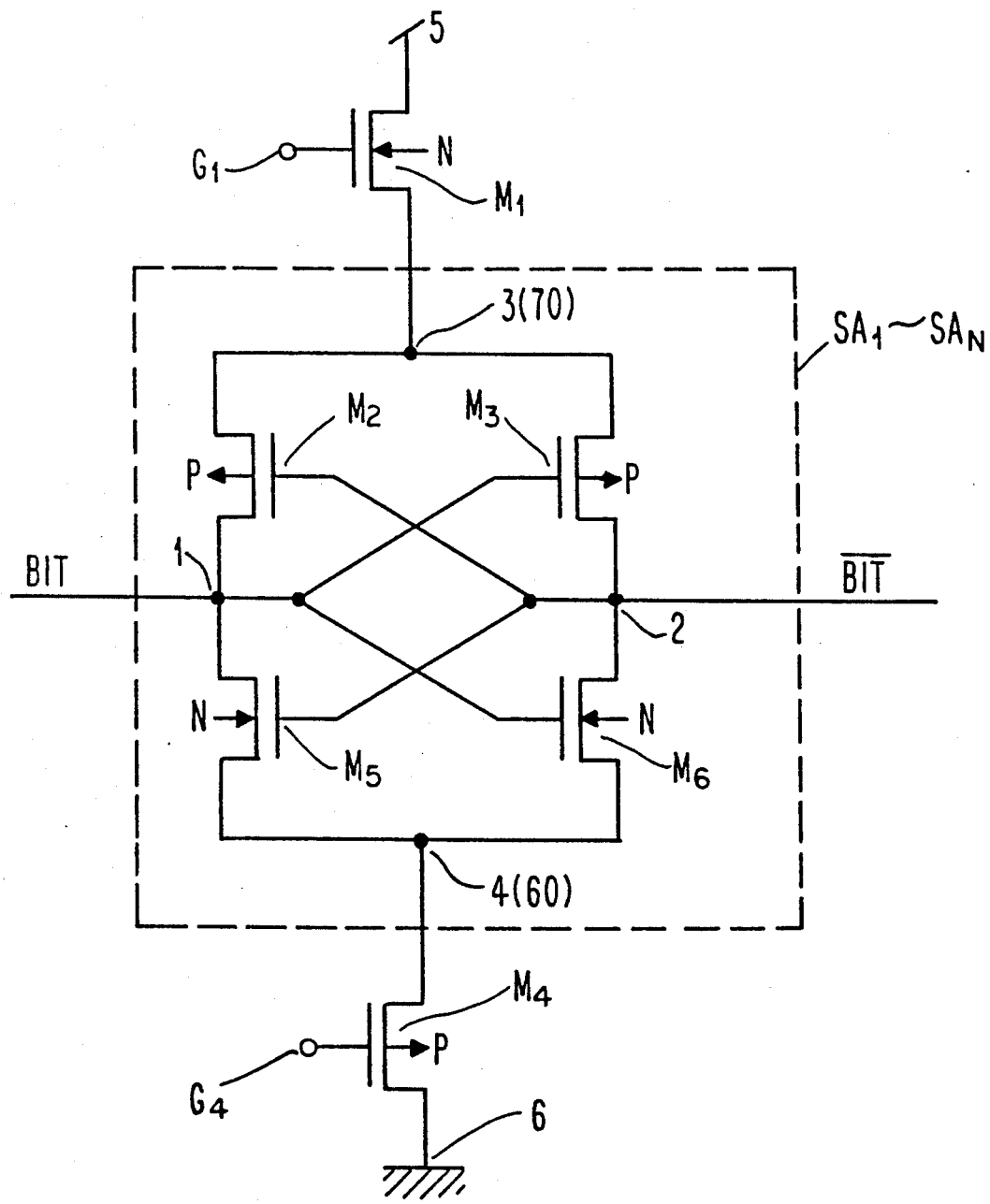
FIG. 1 is a circuit diagram showing the construction in the vicinity of a sense amplifier in a memory device according to the invention.

With reference to FIG. 1, an embodiment of a circuit configuration for realizing the above-described condition will be described. The embodiment shown in FIG. 1 is characterized in that a pull-down transistor $M_4$ has a P-channel so that the potential rise of a word line can be prevented from occurring. As mentioned before, a pull-up transistor in a conventional device has an N-channel. In the embodiment of FIG. 1, a first bit line BIT is connected to a first node 1, and a second bit line /BIT to a second node 2. The source and drain of an N-channel MOS transistor $M_1$ are connected to a third node 3 and a first power supply line 5. The third node 3 corresponds to the common pull-up line 70 shown in FIG. 5. A P-channel MOS transistor $M_2$ is connected between the nodes 1 and 3, and a P-channel MOS transistor $M_3$ between the nodes 2 and 3. The source and drain of a P-channel MOS transistor $M_4$ are connected to a second power supply line 6 (in this embodiment, a ground line) and a fourth node 4 which corresponds to the common pull-down line 60. An N-channel MOS transistor $M_5$ is connected between the nodes 1 and 4, and an N-channel MOS transistor $M_6$ between the nodes 2 and 4. The gates of the transistors $M_2$ and $M_5$ are connected to the node 2, and the gates of the transistors $M_3$ and $M_6$ to the node 1. The MOS transistors $M_2$, $M_3$, $M_5$ and $M_6$ constitute a sense amplifier having a CMOS type flip-flop circuit, which corresponds to the sense amplifiers $SA_1$-$SA_N$ shown in FIG. 5. The sense amplifier of the embodiment differs from conventional sense amplifiers in that the pull-up transistor $M_1$ is of the N-type instead of the P-type, and that the pull-down transistor $M_4$ connected to the minus (ground) level 6 is of the P-type instead of the N-type.

When the voltage of the first power supply line 5 is 5 V and that of the second power supply line 0 V, the potentials of the bit lines BIT and /BIT in a memory device using the sense amplifier shown in FIG. 1 change as indicated by curve c and b in FIG. 2, respectively.

In the memory device according to the invention, the potential difference $V_B$ between the potential of an unselected word line and that of a memory cell storing the logic value "0" equals the threshold voltage $V_{TP}$ of the P-channel MOS transistor $M_4$ (which is about 1 V) because of the following reason. The node 4 is connected to the source of the P-channel MOS transistor $M_4$, and the transistor $M_4$ is driven by applying the voltage of 0 V to the potential of the gate $G_4$. Since the circuitry including the transistor $M_4$ constitutes a so-called source follower circuit, however, the potential of the node 4 cannot be lowered below the threshold voltage $V_{TP}$ (about 1 V).

Figure 9:
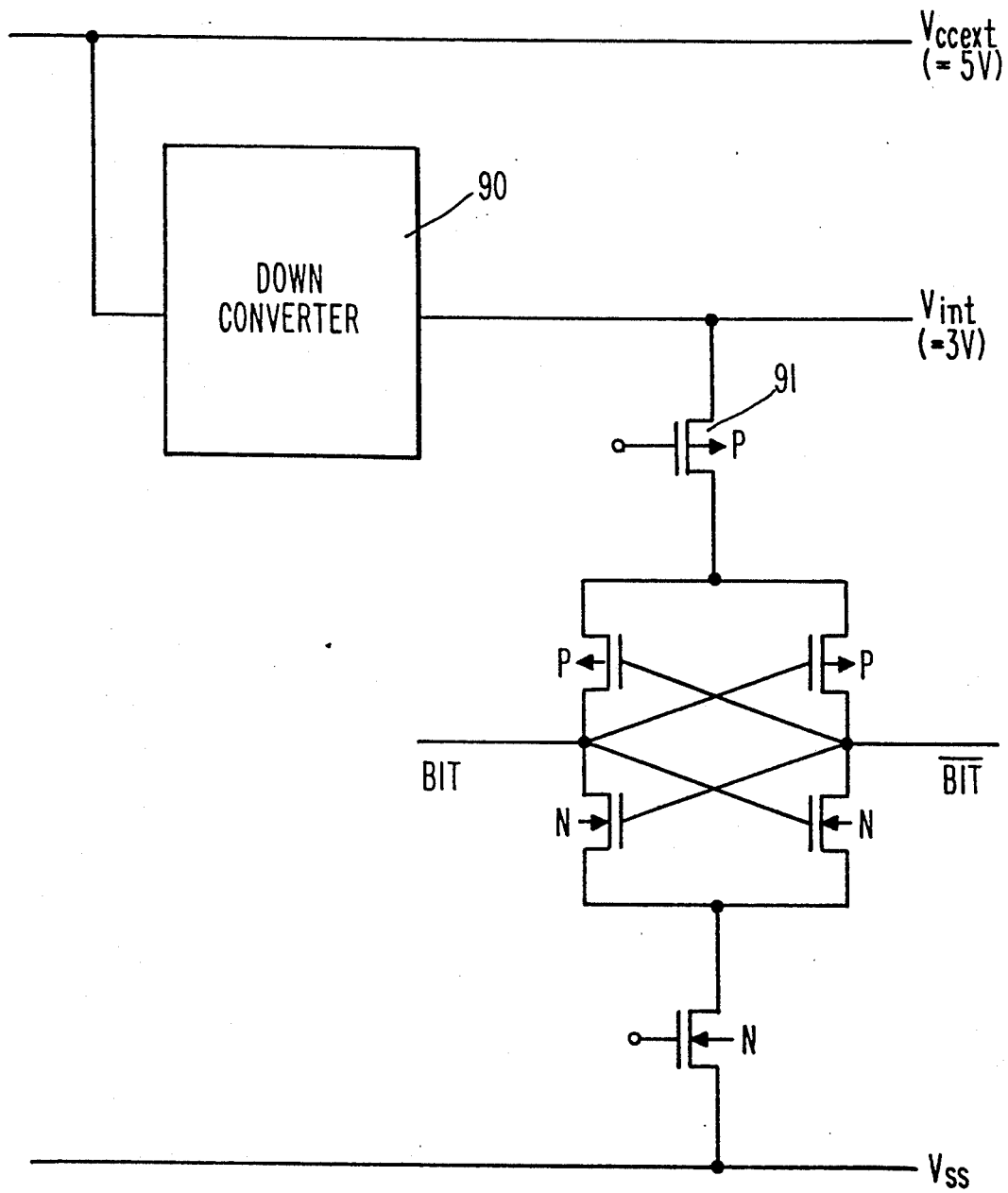
FIG. 9 is a diagram illustrating the vicinity of a sense amplifier in a conventional memory device.

When the potential of a selected word line at the word line selection is set to the same level as that of the plus power supply, the potential difference $V_U$ between the potential level at the word line selection and the memory cell potential corresponding to the logic value "1" is equal to the threshold voltage $V_{TN}$ (about 1 V) of the N-channel MOS transistor $M_1$. The maximum voltage appearing across the source and drain of a switching transistor of a memory cell can be selected to be 3 V. This results in the improved reliability of the transistor because a transistor in which a greater voltage is applied between the source and drain deteriorates more rapidly. In the prior art, as shown in FIG. 9, an external power supply voltage $V_{ccext}$ (=5 V) is reduced to an internal voltage $V_{int}$ (=3 V) by a down converter 90, and the internal voltage $V_{int}$ is applied to a pull-up transistor 91 so that a relatively low voltage is supplied to bit lines BIT and /BIT. This causes the source-drain voltage of a switching transistor to become 3 V, thereby assuring the reliability of the transistor. Such a conventional configuration in which a down converter is used has various drawbacks such as the down converter occupies a substantially large area, the down converter consumes power, and wirings for both $V_{ccext}$ and $V_{int}$ are required to be formed in an LSI chip. The present invention can eliminate also these drawbacks.

As seen from above, in the preferred embodiment, the potential of a memory cell the contents of which corresponds to logic value "0" can be easily raised by 0.3 V or more above the potential of a unselected word line.

The present invention exhibits another advantage that a semiconductor memory device is not easily affected by substrate noises caused from peripheral circuits. When the potential of a substrate is increased by a noise from a peripheral circuit to cause the potential of a memory cell having a PN diode and formed in the substrate to exceed the turn-on voltage (about 0.6 V) of the diode, data stored in a memory cell (e.g., "0" V) of a conventional memory device is destroyed. In contrast, according to the invention, the potential of a memory cell the contents of which corresponds to logic value "0" is set to be greater by 0.3 V or more than the potential of a substrate voltage. Therefore, in the memory device of the invention, the destruction of data does not occur until noises accumulate in the substrate to produce a potential higher than the sum of 0.6 V and 0.3 V (i.e., a value from 0.9 V to 1 V).

In the above-illustrated embodiment, an N-channel transistor is used as the transistor $M_1$ so that the maximum source-drain voltage of the transistors constituting the sense amplifier is reduced, thereby increasing the reliability of the transistors. When the memory device is designed so as to be provided with sufficient reliability, the pull-up transistor may be a P-type one. In this case, the sense circuitry operates at a high speed.

In the embodiment, the sense amplifier has a CMOS type flip-flop circuit. When the pull-down transistor at the side of the minus (ground) voltage supply is of the P-type instead of the N-type, the sense amplifier may consist of NMOS transistors only.

When a P-type transistor is used as the switching transistor in a memory cell, a memory device according to the invention can be realized by replacing the conductivity type of each transistors described above with the other conductivity type and also by replacing the connecting position of the voltage supply lines with each other. In this case, the positions of the power source and the ground in FIG. 1 are replaced with each other, and the power source generates a negative voltage. The potential of the word line ranges from 0 V to −5 V. When the potential of the word line is 0 V, the memory cell is unselected, and, when the potential is −5 V, the memory cell is selected. The potential of the bit line ranges from −1 V (:"0") to −4 V (:"1").

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:
1. A semiconductor device comprising:
   a plurality of memory cells capable of being selected for use or remaining unselected, at least one unselected memory cell having a logical value of "0" and having a first signal voltage potential;
   at least one selected memory cell having a logical value of "1" and having a second signal voltage potential;
   a first set of reading and restoring word lines connected to selected memory cells, said first set of word lines having a signal voltage potential which is higher than said second signal voltage potential by a first predetermined value; and
   a second set of word lines connected to unselected memory cells, said second set of word lines having a signal voltage potential which is higher than said first signal voltage potential by a second and different predetermined value.

2. A semiconductor memory device according to claim 1, wherein said second and different predetermined value is 0.3 V or more.

* * * * *